United States Patent [19]

Miyata

[11] Patent Number: 5,740,177
[45] Date of Patent: Apr. 14, 1998

[54] METHOD OF CORRECTING ERROR, SUITABLE FOR STORAGE DEVICE

[75] Inventor: Manabu Miyata, Tokyo, Japan

[73] Assignee: Oki Electric Industry Co., Ltd., Tokyo, Japan

[21] Appl. No.: 740,899

[22] Filed: Nov. 4, 1996

[51] Int. Cl.$^6$ ........................................ G06F 11/00
[52] U.S. Cl. ........................................ 371/10.2
[58] Field of Search .................. 371/10.2, 21.1, 371/37.7, 21.4, 21.6

[56] References Cited

U.S. PATENT DOCUMENTS 5,268,870  12/1993  Harari ..................... 371/10.2
5,367,652  11/1994  Golden et al. ............ 371/10.2
5,438,573   8/1995  Mangan et al. ........... 371/21.6
5,471,478  11/1995  Mangan et al. ........... 371/10.2
5,475,693  12/1995  Christopherson et al. .. 371/21.4

*Primary Examiner*—Vincent P. Canney
*Attorney, Agent, or Firm*—Rabin, Champagne, & Lynt, P.C.

[57] ABSTRACT

A method of correcting an error, which is suitable for use in a storage device. When the error exists in data read from a storage region of a storage medium having the storage region and a spare region and the read data is correctable, the read data is corrected. The number of defective bits included in the read data is detected. Only when the number of the defective bits exceeds and equals a predetermined value, the storage region storing therein the read data is prohibited from being used and an alternate process for storing corrected data in the spare region is executed.

7 Claims, 5 Drawing Sheets

METHOD OF CORRECTING ERROR, SUITABLE FOR STORAGE DEVICE

BACKGROUND OF THE INVENTION

1. Field of the Invention

This invention relates to a method of correcting an error produced when data is read from a storage region of a storage device such as a semiconductor disc device, a magnetic disc device or the like and executing a suitable process.

2. Description of the Related Art

A storage device for storing a large quantity of data or programs therein has been employed in an information processing apparatus. A magnetic disc device, a floppy disc device or a semiconductor disc device composed of a semiconductor is known as a storage device. Data which has been written into the storage device is read out and utilized upon execution of various applications. It should be ensured that the date is read with high reliability. Thus, in case of the occurrence of an error in the read data, data for correcting the error is added when the data is written into the storage device.

Now, consider a semiconductor disc device using a flash memory or the like, for example. When data is repeatedly read out from the semiconductor disc device and written therein, and the number of times that its read/write process is repeated reaches a predetermined value or more, data storage operations become unstable and thereafter data writing is disabled.

SUMMARY OF THE INVENTION

With the foregoing in view, it is an object of the present invention to effectively utilize a spare region of a storage medium.

According to one aspect of the present invention, for achieving the above object, there is provided a method of correcting an error, suitable for use in a storage device, wherein when the error exists in data read from a storage region of a storage medium having the storage region and a spare region and the read data is correctable, the read data is corrected, comprising the following steps:

a step for detecting the number of defective bits included in the read data; and a step for prohibiting the use of the storage region storing therein the read data only when the number of the defective bits exceeds and equals to a predetermined value and executing an alternate process for storing corrected data in the spare region.

Further, the present inventions includes other various embodiments made to achieve the above-described object. This invention will be understood from the appended claims, the following embodiments and the accompanying drawings.

BRIEF DESCRIPTION OF THE DRAWINGS

While the specification concludes with claims particularly pointing out and distinctly claiming the subject matter which is regarded as the invention and it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings.

Figure 1:
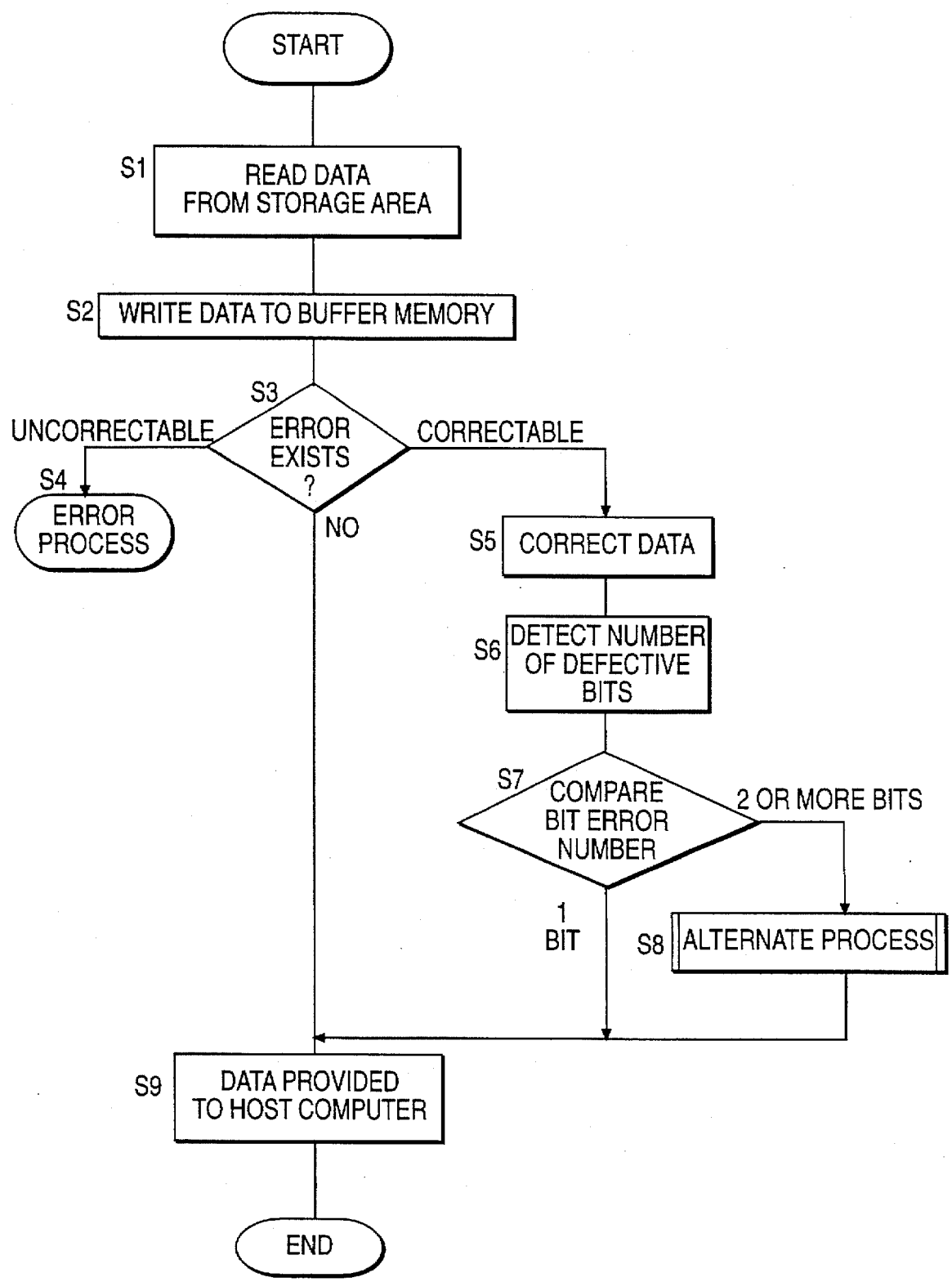
FIG. 1 is a view for describing a first embodiment of the present invention.
Figure 2:
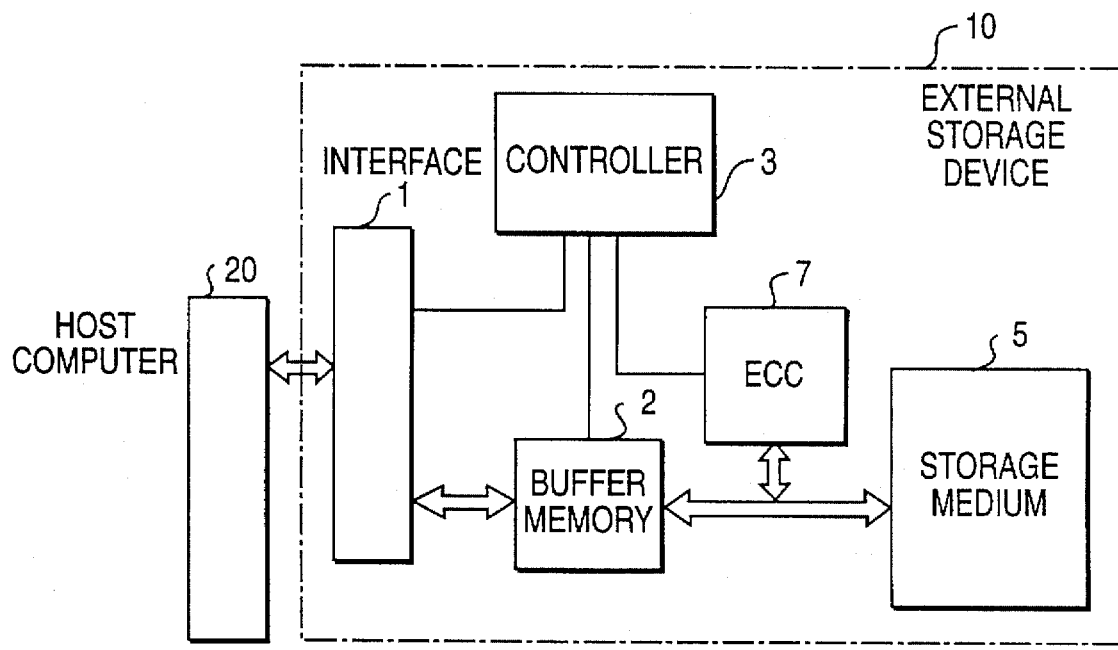
FIG. 2 is a block diagram showing configurations of an external storage device and a host computer.

FIG. 1 is a view for describing a first embodiment of the present invention. Prior to the description of FIG. 1, the structure of a storage device according to the present invention will be described. FIG. 2 is a block diagram showing configurations of both an external storage device corresponding to the storage device according to the present invention, and a host computer.

The external storage device 10 is composed of a semiconductor disc device, for example. The external storage device 10 is electrically connected to the host computer 20. The external storage device 10 writes data therein and reads it therefrom. The external storage device 10 comprises an interface 1, a buffer memory 2, a controller 3, an ECC (Error Correction circuit) unit 4, and a storage medium 5.

Figure 3:
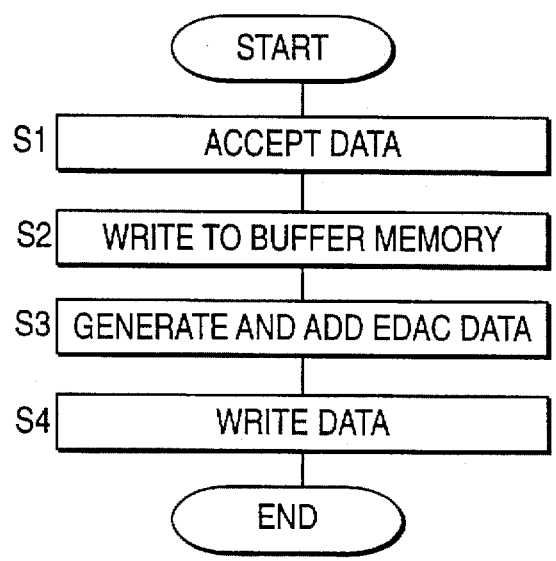
FIG. 3 is a flowchart for describing a write operation of the external storage device shown in FIG. 2.

FIG. 3 is a flowchart for explaining the write operation of the external storage device.

The writing of the data into the external storage device 10 is performed in accordance with the following procedural steps.

In Step S1, the external storage device 10 accepts therein data through the interface 1. In Step S2, the data is written into the buffer memory 2. In the next Step S3, the ECC unit 4 generates data for detecting and correcting an error which occurs in the accepted data and adds it to the accepted data. In Step S4, the data is written into the storage medium 5.

Referring back to FIG. 1, the read operation of the external storage device 10 will be described.

In Step S1, data is first read out from a storage area or region 11 (refer to FIG. 4 to be described later) of the storage medium 5. This reading is performed on a sector basis, for example. In Step S2, the read data is written into the buffer memory 2. In Step S3, the ECC unit 4 checks whether an error exists in the data. If an error don't exist in the data in Step S3, then the operation proceeds to Step S9 where the data is outputted to the host computer. If an error exists in the data in Step S3, i.e., the error is found to be an uncorrectable error, then the operation proceeds to Step S4 where an error process is executed. This error process is a process of making a data re-transmit request or outputting various error messages. If the error is judged as a correctable error in Step S3, then the operation proceeds to Step S5 where the data is corrected. In Step S6, the number of defective bits in the data is detected. Namely, when data corresponding to one sector is read out, detection is made as to how many defective bits there are in the data. In Step S7, the number of the defective bits is compared with a predetermined value. Here, a data error, which occurs due to external noise or the like, is one bit in most cases. On the other hand, an error which arises due to an unstable operation or a failure of the storage medium is often two bits or more. Thus, when the predetermined value is set to "2", for example, the process to follow is changed from one relevant to when the error (error expressed in one bit) is produced due to external noise to one relevant to when the error (error expressed in two bits or more) is caused by a storage medium failure. Namely, if the number of defective bits is "1", then the operation proceeds to Step S9 where the corrected data is outputted to the host computer. On the other hand, when the number of defective bits is "2 or more", the corrected data is similarly outputted to the host computer, but an alternate process is performed in Step S8 prior to or after its output or in concurrence therewith.

Figure 4:
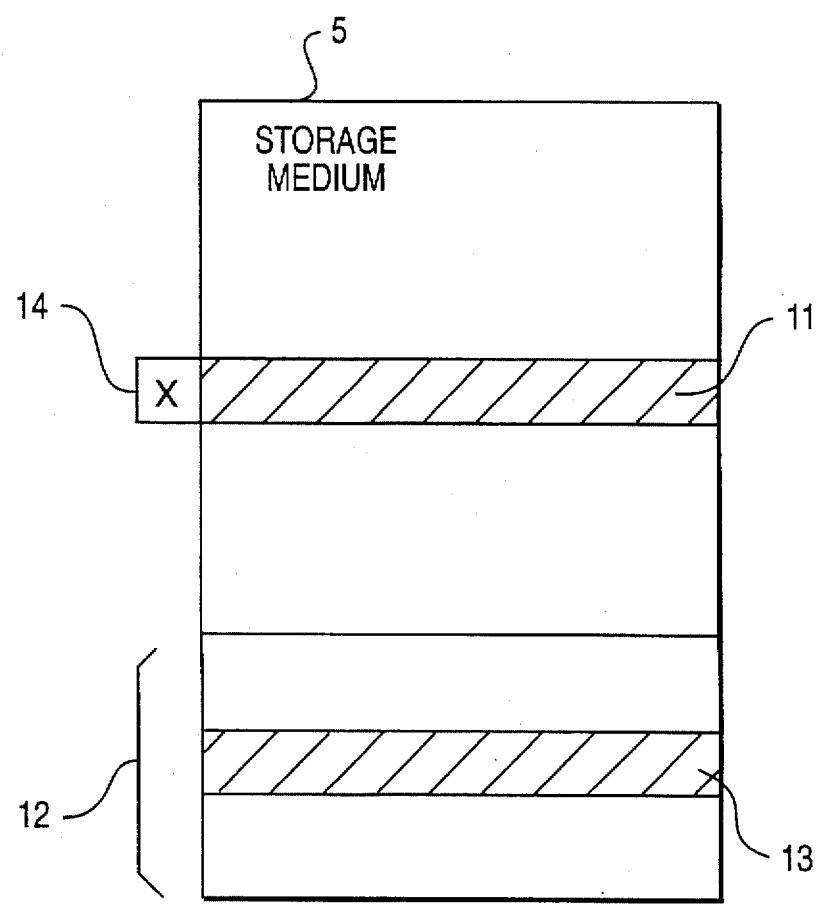
FIG. 4 is a view for explaining the operation of an alternate process.

FIG. 4 is a view for explaining the operation of the alternate process.

When the number of defective bits included in the data read from the storage region 11 of the storage medium 5 is "2 or more", the corrected data is sent to the host computer and is stored in a vacant region 13 which exists in a spare region 12 of the storage medium 5. A defective mark 14 is applied to the storage region 11 and usage of the storage region 11 is thereafter prohibited. Thus, the vacant region 13 is used as an alternate sector in place of the storage region 11.

In the first embodiment, whether or not the alternate process is to be executed is determined depending on the number of defective bits. Thus, when, an error expressed in one bit is produced (i.e., when an error occurs in data read due to external noise), the alternate process is not performed. Accordingly, the spare region of the storage medium is saved. Further, when an error (caused by the storage medium) expressed in two bits or more occurs, the alternate process is executed.

When the one-bit error arises, the corrected data may be written into the storage region 11.

Figure 5:
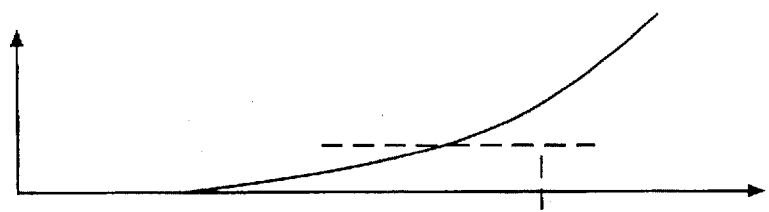
FIGS. 5 and 6 are views for describing the operation of a memory element of a semiconductor disc device.
Figure 6:
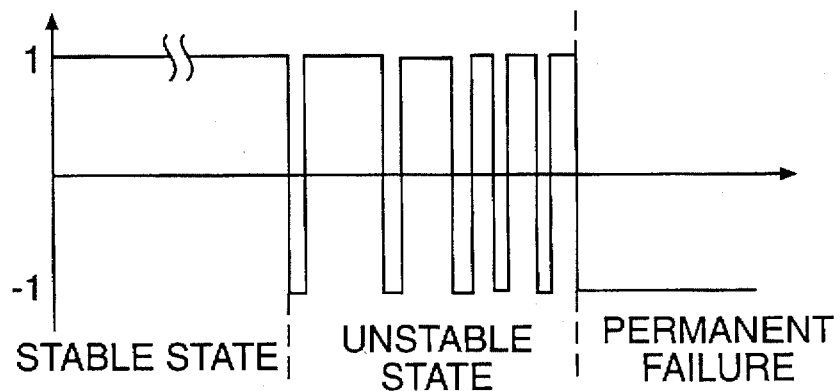

FIGS. 5 and 6 are views for explaining the operation of a memory element of the semiconductor disc device.

A description will now be made of how the memory element of the semiconductor disc device comes about or changes according to the number of times that a read/write operation is performed.

In FIG. 5, the vertical axis indicates a value obtained by accumulating errors produced when data is read from the storage medium, and the horizontal axis indicates the number of times that a read/write operation is performed.

In FIG. 6, the horizontal axis indicates the number of times that a read/write operation is performed, and the vertical axis indicates "1" when data is normal and "−1" when an error occurs in the data.

Referring to FIGS. 5 and 6, when the number of times that a read/write operation is performed, is small, the memory element is stable and does not yet produce an error. With an increase in the number of times that a read/write operation is performed, the memory element gradually becomes unstable and an accumulated error value also increases. With a further increase in the number of times that a read/write operation is performed, the memory element finally experiences a permanent failure and hence the accumulated error value linearly increases.

In a second embodiment, the property of such a semiconductor disc device is used. When the accumulated error value exceeds a limit value shown in FIG. 5, the alternate process is executed. In the second embodiment, the alternate process is executed immediately before or after the operation of the memory element becomes unstable or according to the timing provided during that time.

Figure 7:
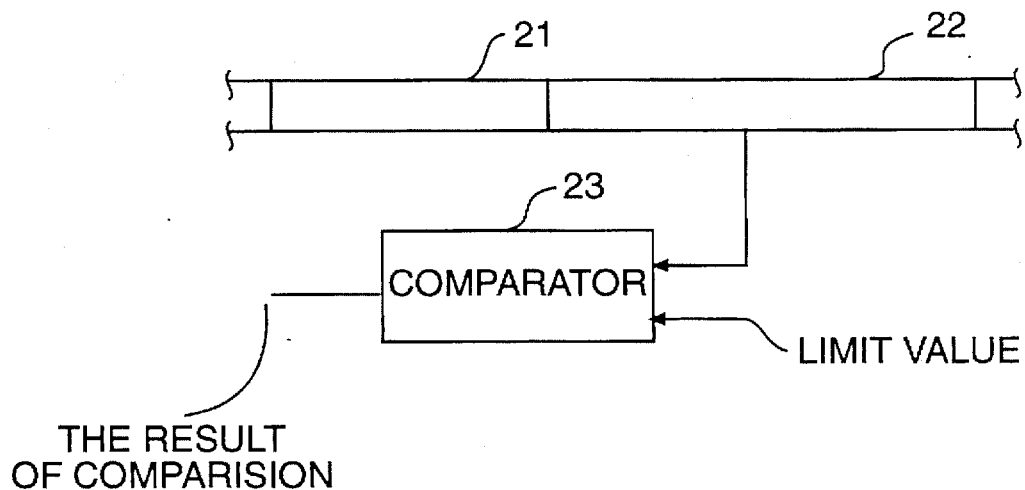
FIG. 7 is a view for explaining the operation of comparison with a limit value.

FIG. 7 is a view for describing a specific process for performing such an operation.

As shown in FIG. 7, data 21 and the number of times 22 that a correctable error occurs, are stored in the storage medium to a carry out such an operation. Further, the data is read and the number of times 22 that a correctable error occurs is read. Thereafter, a comparator 23 compares the number of times that an error arises with a limit value and outputs the result of comparison therefrom.

Figure 8:
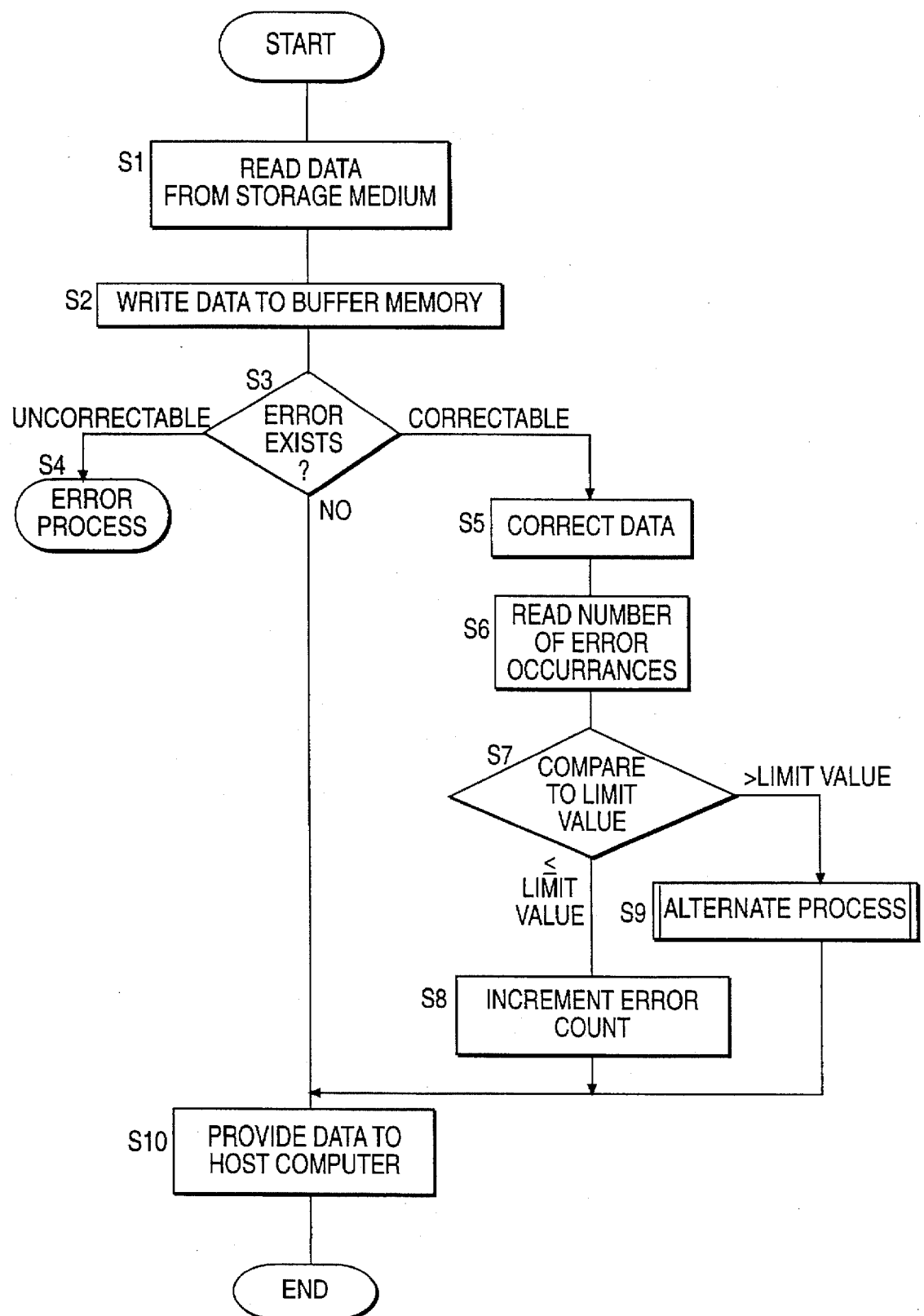
FIG. 8 is a view for describing a second embodiment of the present invention.

FIG. 8 is a view for explaining the second embodiment of the present invention.

In Step S1, data is first read from a storage region 11 of a storage medium 5. In Step S2, the read data is written into a buffer memory 2. Whether an error occurs in the data is checked in Step S3. If an error doesn't occur in Step S3, then the routine procedure proceeds to Step S10 where the data is outputted to a host computer. If an error occurs in Step S3, i.e., the error is found to be an uncorrectable error, then the operation proceeds to Step S4 where the above-described error process is executed. If the error is found to be a correctable error in Step S3, then the operation proceeds to Step S5 where the data is corrected. Further, the number of times that the correctable error occurs is read in Step S6. Next, the predetermined limit value and the number of times that the correctable error occurs are compared in Step S7. The predetermined limit value is set in consideration of the accumulated value of errors due to external noise when the storage region of the storage medium is used up to as close as the number of the times which reaches the lifetime thereof. When the number of times that the correctable error occurs is smaller than or equal to the limit value, the number of times that the correctable error has occurred and "1" is added and stored in the storage region 11 in step 8. The number is used in the next read process. In Step S10, the corrected data is sent to the host computer. On the other hand, when the number of times that the correctable error occurs exceeds the limit value, the operation proceeds to Step S9 where the above-described alternate process is executed.

In the second embodiment, whether the alternate process should be done is judged using the accumulated value of the errors as the reference. Thus, since the semiconductor disc device has a strong tendency to perform the operation shown in FIG. 6 in particular, it is possible to manage an alternate process suitable for this.

In order to perform the alternate process during an unstable operation stage, the frequent occurrence of an error during a relatively short period or short interval may be detected. Thus, the number of times that a correctable error occurs during a predetermined period or interval may be compared with the limit value without making a comparison between the number of times that the correctable error occurs, produced from the time of the commencement of usage of the storage region, and the limit value. Namely, the alternate process may be executed with the frequency of error correction as the reference. If errors occur continuously several times, then it can be regarded as the permanent failure. Thus, when errors occur continuously for a predetermined number of times, the alternate process may be executed.

Further, when the number of times that a correctable error occurs is less than or equal to the limit value in the above-described embodiment, the corrected data may be written into the storage region 11.

The above-described embodiments have been described using semiconductor disc devices as illustrative examples.

However, various storage devices such as a magnetic disc device, a floppy disc device, etc. are similar in property to each other. Thus, the management of a suitable alternate process can be performed by applying either one of the embodiments mentioned previously to any of the devices. Accordingly, the spare region in the storage medium can be effectively used.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of determining if a spare region of a storage medium is to be used, which is suitable for use with a storage device, wherein when an error exists in data read from a storage region of the storage medium having the storage region and the spare region and the read data is correctable, the read data is corrected, comprising:

detecting a number of defective bits included in the read data;

storing data obtained by correcting the read data in said storage region when the number of the defective bits is less than a predetermined number;

prohibiting use of said storage region storing therein the read data only when the number of the defective bits exceeds or is equal to the predetermined number; and executing an alternate process for storing the data obtained by correcting the read data in said spare region only when the number of the defective bits exceeds or is equal to the predetermined number.

2. A method of determining if a spare region of a storage medium is to be used, which is suitable for use with a storage device, wherein when an error exists in data read from a predetermined region in a storage region of the storage medium having the storage region and the spare region and the read data is correctable, the read data is corrected, comprising:

prohibiting use of said predetermined region storing therein the read data only when a number of times that the read data is corrected or a number of times near the number of times that the read data is corrected, exceeds a predetermined value; and executing an alternate process for storing data obtained by correcting the read data in said spare region only when the number of times that the read data is corrected or the number of times near the number of times that the read data is corrected, exceeds the predetermined value.

3. A method according to claim 2, wherein when the number of times that the read data is corrected or the number of times near the number of times that the read data is corrected, does not exceed the predetermined value, the data obtained by correcting the read data is written into said predetermined region.

4. A method of determining if a spare region of a storage medium is to be used, which is suitable for use with a storage device, wherein when an error exists in data read from a predetermined region in a storage region of the storage medium having the storage region and the spare region and the read data is correctable, the read data is corrected, comprising:

prohibiting use of said predetermined region storing therein the read data when the read data is corrected continuously over a predetermined number of times; and executing an alternate process for storing data obtained by correcting the read data in said spare region, when the read data is corrected continuously over the predetermined number of times.

5. A method according to claim 4, wherein when the correction of the read data is noncontinuous over the predetermined number of times, the data obtained by correcting the read data is written into said predetermined region.

6. A method of determining if a spare region of a storage medium is to be used, which is suitable for use with a storage device, wherein when an error exists in data read from a predetermined region in a storage region of the storage medium having the storage region and the spare region and the read data is correctable, the read data is corrected, comprising:

prohibiting use of said predetermined region storing therein the read data when a frequency of correction of the read data exceeds a predetermined value; and executing an alternate process for storing data obtained by correcting the read data in said spare region when the frequency of correction of the read data exceeds the predetermined value.

7. A method according to claim 6, wherein when the frequency of correction of the read data does not exceed the predetermined value, the data obtained by correcting the read data is written into said predetermined region.

* * * * *